(12) United States Patent
Powney et al.

(10) Patent No.: US 11,259,414 B2
(45) Date of Patent: Feb. 22, 2022

(54) FLEX ON BOARD ANISOTROPIC CONDUCTIVE ADHESIVE INTERCONNECTION

(71) Applicant: HUAWEI TECHNOLOGIES CO., LTD., Shenzhen (CN)

(72) Inventors: David Powney, Kista (SE); Ilkka Saarinen, Helsinki (FI); Mikko Kylkilahti, Helsinki (FI); Lei Han, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/770,483

(22) PCT Filed: Dec. 22, 2017

(86) PCT No.: PCT/EP2017/084519
§ 371 (c)(1),
(2) Date: Jun. 5, 2020

(87) PCT Pub. No.: WO2019/120583
PCT Pub. Date: Jun. 27, 2019

(65) Prior Publication Data
US 2020/0389982 A1   Dec. 10, 2020

(51) Int. Cl.
*H05K 1/00* (2006.01)
*H05K 3/32* (2006.01)
(Continued)

(52) U.S. Cl.
CPC ............ *H05K 3/323* (2013.01); *H05K 1/189* (2013.01); *H05K 3/361* (2013.01); *H05K 2201/094* (2013.01); *H05K 2201/09381* (2013.01)

(58) Field of Classification Search
CPC ........ H05K 3/323; H05K 3/361; H05K 1/189; H05K 2201/09381; H05K 2201/094
(Continued)

(56) References Cited

U.S. PATENT DOCUMENTS

2001/0033355 A1   10/2001   Hagiwara
2002/0044329 A1    4/2002   Shoji
(Continued)

FOREIGN PATENT DOCUMENTS

CN        1065372 A       10/1992
CN        1310475 A        8/2001
(Continued)

OTHER PUBLICATIONS

International search report dated Sep. 12, 2018 from corresponding application No. PCT/EP2017/084519.
(Continued)

*Primary Examiner* — Andargie M Aychillhum
(74) *Attorney, Agent, or Firm* — Hauptman Ham, LLP (57) ABSTRACT

An apparatus includes a printed circuit board and a flexible printed circuit. A rigid structure component is on a first side of the printed circuit board. An interconnection interface is on a second side of the printed circuit board opposite to the rigid structure component and is configured to interconnect the flexible printed circuit and the printed circuit board. A conductive interconnection material is at the interconnection interface between the flexible printed circuit and the printed circuit board.

18 Claims, 5 Drawing Sheets

(51) Int. Cl.
*H05K 1/18* (2006.01)
*H05K 3/36* (2006.01)

(58) Field of Classification Search
USPC .......................................................... 361/749
See application file for complete search history.

(56) References Cited

U.S. PATENT DOCUMENTS

| | | |
|---|---|---|
| 2005/0098902 A1 | 5/2005 | Ho et al. |
| 2013/0042955 A1 | 2/2013 | Yeates et al. |
| 2013/0081674 A1* | 4/2013 | Joe ..................... H01L 31/0516 |
| | | 136/251 |
| 2014/0321075 A1 | 10/2014 | Sung et al. |
| 2017/0048977 A1* | 2/2017 | Siddique ................. H01L 24/83 |

FOREIGN PATENT DOCUMENTS

| | | |
|---|---|---|
| CN | 1338880 A | 3/2002 |
| CN | 1645985 A | 7/2005 |
| CN | 1658334 A | 8/2005 |
| CN | 106852197 A | 6/2017 |
| JP | 2003322873 A | 11/2003 |
| WO | 2009100103 A2 | 8/2009 |

OTHER PUBLICATIONS

Chinese Office Action issued in corresponding Chinese Office Action No. 201780097884.9, dated Dec. 28, 2020, pp. 1-8.
Chinese Search Report issued in corresponding Chinese Office Action No. 201780097884.9, dated Dec. 17, 2020, pp. 1-3.
Chinese Notice of Allowance issued in corresponding Chinese Application No. 201780097884.9, dated Jan. 12, 2022, pp. 1-4.

* cited by examiner

FLEX ON BOARD ANISOTROPIC CONDUCTIVE ADHESIVE INTERCONNECTION

CROSS-REFERENCE TO RELATED APPLICATIONS

This application is a National Stage of International Patent Application No. PCT/EP2017/084519, filed on Dec. 22, 2017.

TECHNICAL FIELD

The aspects of the present disclosure relate generally to circuit board assemblies and more particularly to an interconnection structure for connecting a flex circuit to a printed circuit board.

BACKGROUND

Physical connectors on printed circuit boards (PCB) have reached their miniaturization limit. Not only are physical connectors large in XY footprint but they possess Z height. ACA (Anisotropic Conductive Adhesive) or other TCB (Thermal Compression Bonding) technology interconnections are effective solutions in ultrafine connector technology as ACA interconnections can generally achieve smaller pitch electrical interconnections than physical connectors. These ACA interconnections can thus offer the most compact interconnection solutions.

However, the typical ACA interconnection generally requires a high pressure bonding process. The bonding jig is equipped with a support element provides rigidity to perform the bonding process. A "component keepout" is thus needed on the back side of the printed circuit board where the support element makes contact with the PCB. The component keepout results in an area on the back side of the PCB that is free from any components. The component keepouts will be complete or partial component keepouts.

As an example, in an Anisotropic Conductive Film (ACF) interconnection, the frame of an RF shield is used during the bonding process as the support structure. The area on the back side of the printed circuit board that is inline with the frame portion of the RF shield that is used as the support structure during the bonding process.

Physical connectors are typically used for interconnections between modules in high current and power applications. In some cases, additional pins are allocated to the power nets so that they are able to carry the high current/power efficiently. Physical connectors and additional pins are not conducive to miniaturized interconnections in flexible circuit interconnection design.

Accordingly, it would be desirable to be able to provide an interconnection structure for a flexible circuit that addresses at least some of the problems identified above.

SUMMARY

It is an object of the disclosed embodiments to provide an apparatus and interconnection structure for connecting a flex circuit to a printed circuit board that minimizes the need for keepout areas and enables transferring high current and power between modules in a small volume. This object is solved by the subject matter of the independent claims. Further advantageous modifications can be found in the dependent claims.

According to a first aspect the above and further objects and advantages are obtained by an apparatus. In one embodiment, the apparatus includes a printed circuit board and a flexible printed circuit. A rigid structure component is disposed on a first side of the printed circuit board. An interconnection interface is disposed on a second side of the printed circuit board opposite to the rigid structure component and is configured to interconnect the flexible printed circuit and the printed circuit board. A conductive interconnection material is disposed at the interconnection interface between the flexible printed circuit and the printed circuit board. The interconnection interface of the disclosed embodiments does not need a keepout area on the second side of the interconnection interface. The second side below the interconnection interface remains usable for component placement.

In a possible implementation form of the apparatus according to the first aspect device the conductive interconnection material is an anisotropic conductive adhesive. The use of an anisotropic conductive adhesive provides a very low height interconnection solution.

In a possible implementation form of the apparatus according to the first aspect as such or the previous implementation form, the conductive interconnection material has a maximum of 4 Megapascal (MPa) bonding pressure. The low bonding pressure needed to achieve a good interconnection ensures that components on the second side of the PCB are not damaged.

In a possible implementation form of the apparatus according to the first aspect as such or according to any one of the preceding possible implementation forms the interconnection interface comprises a first interconnection terminal and a second interconnection terminal, wherein the first interconnection terminal is disposed on one of the flexible printed circuit or the printed circuit board and the second interconnection terminal is disposed on the other one of the flexible printed circuit or the printed circuit board. The conductive interconnection material is disposed between the first interconnection terminal and the second interconnection terminal. The aspects of the disclosed embodiments provide a flexible solution for both Flex on Board (FoB) and Flex on Flex (FoF) interconnection applications.

In a further possible implementation form of the apparatus according to the first aspect as such or according to any one of the preceding possible implementation forms a shape of the rigid structure component is irregular and a shape of a support block is configured to correspond to the irregular shape of the rigid structure component. The component on the first side of the printed circuit board that is used as the rigid component during the bonding process does not have to have a flat surface, which provides greater choice in the selection of the rigid component and the placement of the interconnection interface.

In a further possible implementation form of the apparatus according to the preceding possible implementation form or according to any one of the preceding possible implementation forms the interconnection interface is positioned on the second side of the printed circuit board in an area that corresponds to a central region of the rigid structure component on the first side of the printed circuit board. The aspects of the disclosed embodiments allow the interconnection interface to be located behind any part of the rigid structure component.

In a further possible implementation form of the apparatus according to the first aspect as such or according to any one of the preceding possible implementation forms, the first interconnection terminal comprises a plurality of adjacent bond pads and the second interconnection terminal comprises a plurality of adjacent bond pads. In a connected state of the flexible printed circuit and the printed circuit board, a channel is formed between a pair of adjacent bond pads of the first terminal and a corresponding bond pad of the second terminal. The channel promotes efficient outflow of the excess conductive interconnection material that is pushed out from between the bond pads when the interconnection interface is compressed and thus ensuring a good electrical and mechanical interconnection.

In a possible implementation form of the apparatus according to the first aspect as such or the previous possible implementation form, a pitch of a pitch pattern of the plurality of adjacent bond pads of the first interconnection terminal is smaller than a pitch of a pitch pattern of the plurality of adjacent bond pads of the second interconnection terminal. The terminal design and combination of terminals of the interconnection interface of the disclosed embodiments enables capacity maximization of current and power handling in the interconnection.

In a possible implementation form of the apparatus according to the first aspect as such or the two previous possible implementation forms at least two adjacent bond pads of the first interconnection terminal form multiple adjoined fingers that in the connected state of the interconnection interface are configured to overlap and connect to one bond pad of the second interconnection terminal. The terminal design and combination of terminals of the interconnection interface of the disclosed embodiments enables capacity maximization of current and power handling in the interconnection. Higher power can be passed through one terminal.

In a possible implementation form of the apparatus according to the first aspect as such or the three previous possible implementation forms the first interconnection terminal comprises a first set of the plurality of adjacent bond pads and a second set of the plurality of adjacent bond pads, wherein a width of a bond pad in the first set is greater than a width of a bond pad in the second set. The aspects of the disclosed embodiments provide design flexibility to suit the electrical requirements, particularly with respect to maximizing the power/current handling capabilities of the interconnection interface and enabling higher power to be passed through one terminal.

In a further possible implementation form of the apparatus according to the first aspect as such or according to the previous possible implementation form the first set of the plurality of adjacent bond pads is configured to be connected to one bond pad of the second interconnection terminal in the connected state. The aspects of the disclosed embodiments provide design flexibility to suit the electrical requirements, particularly with respect to maximizing the power/current handling capabilities of the interconnection interface and enabling higher power to be passed through one terminal.

In a further possible implementation form of the apparatus according to the first aspect as such or according to any one of the previous possible implementation forms a bonding support block is disposed against the rigid support component. The aspects of the disclosed embodiments enable components to be disposed on the printed circuit board behind the interconnection area.

According to a second aspect, the above and further objects and advantages are obtained by a method for bonding a flexible printed circuit to a printed circuit board. In one embodiment, the method includes mounting a rigid structure component on a first side of the printed circuit board, providing an interconnection interface on a second side of the printed circuit board opposite to the rigid structure component, the interconnection interface being configured to connect the flexible printed circuit to the printed circuit board, providing a conductive interconnection material at the interconnection interface between the flexible printed circuit and the printed circuit board; applying pressure and heat to the interconnection interface to compress the conductive interconnection material between the flexible printed circuit and the printed circuit board and electrically connect the flexible printed circuit to the printed circuit board. The interconnection interface of the disclosed embodiments does not need a keepout area on the second side of the interconnection interface. The second side below the interconnection interface remains usable for component placement.

According to a third aspect, the above and further objects and advantages are obtained by an interconnection interface for for bonding a flexible printed circuit to a printed circuit board. In one embodiment the interconnection interface includes a first interconnection terminal with a plurality of adjacent bond pads, a second interconnection terminal with a plurality of adjacent bond pads, wherein the first interconnection terminal and the second interconnection terminal are configured to be pressed together in a connected state of the flexible printed circuit and the printed circuit board; and a channel disposed between a pair of the plurality of adjacent bond pads of the first interconnecting terminal and a corresponding bond pad of the plurality of adjacent bond pads of the second interconnection terminal. The terminal design and combination of terminals of the interconnection interface of the disclosed embodiments enables capacity maximization of current and power handling in the interconnection. Higher power can be passed through one terminal.

In a possible implementation form of the interconnection interface according to the third aspect as such, a conductive interconnecting material is disposed between the first interconnection terminal and the second interconnection terminal. The interconnection interface of the disclosed embodiments provides a low height interconnection solution.

According to a fourth aspect, the above and further objects and advantages are obtained by device. In one embodiment, the device is an apparatus according to any one of the possible previous implementation forms.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosure, for which reference should be made to the appended claims. Additional aspects and advantages of various embodiments will be set forth in the description that follows, and in part will be obvious from the description, or may be learned by practice. Moreover, the aspects and advantages of various embodiments may be realized and obtained by means of the instrumentalities and combinations particularly pointed out in the appended claims.

BRIEF DESCRIPTION OF THE DRAWINGS

Aspects of the present disclosure will be explained in more detail with reference to the example embodiments shown in the drawings, in which.

DETAILED DESCRIPTION OF THE DISCLOSED EMBODIMENTS

Figure 1A:
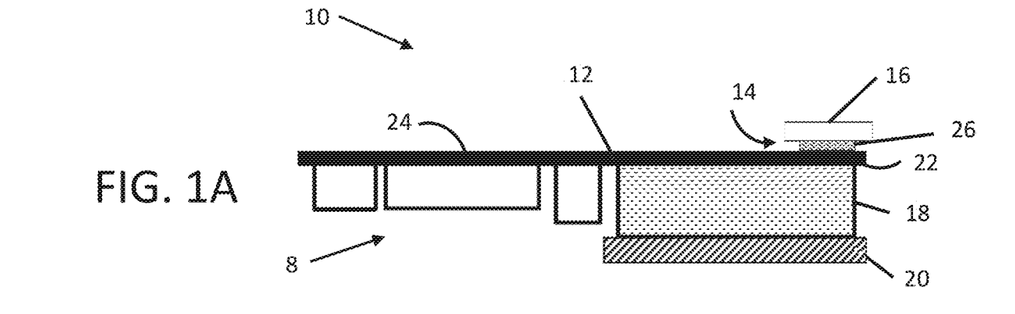
FIGS. 1A and 1B are block diagrams illustrating an apparatus including an exemplary interconnection assembly incorporating aspects of the disclosed embodiments.

Referring to FIG. 1A there can be seen an exemplary schematic block diagram of an apparatus 10 incorporating aspects of the disclosed embodiments. The apparatus 10 includes a printed circuit board 12 and a flexible printed circuit 16. An interconnection interface assembly 14 is used to electrically connect the printed circuit board 12 to the flexible printed circuit 12. The aspects of the disclosed embodiments are configured to provide an interconnection interface assembly for connecting the printed circuit board 12 to the flexible printed circuit 16 that eliminates the need for a keepout on the back side of the interconnection interface assembly and enables the use of high current and power within the interconnection between the modules.

Although the aspects of the disclosed embodiments will generally be described herein with respect to an interconnection assembly for and between a printed circuit board (PCB) 12 and a flexible printed circuit (FPC) 16, the aspects of the disclosed embodiments are not so limited. In alternate embodiments, the aspects of the disclosed embodiments can include interconnections for and between flexible printed circuits, Flex on Board (FoB) and Flex on Flex (FoF) applications.

In the example shown in FIG. 1A, the apparatus 10 includes a rigid structure component 18 disposed on a first side 22 of the printed circuit board 12. In one embodiment, the first side 22 of the printed circuit board 12 can also include surface mount technology (SMT) components and devices 8. The rigid structure component 18 generally includes a suitable electronic component or device that is mounted on the printed circuit board 12. Examples of rigid structure components 18 can include, but are not limited to, single in-line memory (SIM) and secure digital card (SD) devices, audio-visual (AV) jacks, receivers, speakers and radio frequency (RF) shield cans. Where the rigid structure component 18 is an RF shield can, the aspects of the disclosed embodiments enable the interconnection assembly of the disclosed embodiments to be placed under any area of the RF shield can other than including proximate to the walls of the RF shield can.

The apparatus 10 includes an interconnection interface or assembly 14 that is used to connect or interconnect the printed circuit board 12 and the flexible printed circuit 16. In the example of FIG. 1A, the interconnection interface 14 is disposed on a second side 24 of the printed circuit board 12. The interconnection interface 14 in this example is disposed substantially opposite to the rigid structure component 18 on the first side 22 of the printed circuit board 12.

In one embodiment, a conductive interconnection material 26 is disposed at the interconnection interface 14 between the flexible printed circuit 16 and the printed circuit board 12. The conductive interconnection material 26 is configured to create an intermetallic layer between the printed circuit board 12 and the flexible printed circuit 16 and maximize the conductivity of the electrical connections. As will be described further herein, the conductive interconnection material 26 is configured to create the intermetallic layer between the electrodes of the interconnection interface 14.

The conductive interconnection material 26 described herein is generally an anisotropic conductive adhesive (ACA). Although anisotropic conductive adhesives are generally referred to herein, the aspects of the disclosed embodiments are not so limited. In alternate embodiments, the conductive interconnection material 26 can include any suitable thermal compression bonding (TCB) technology, such as for example anisotropic conductive films (ACF), low pressure anisotropic conductive paste (ACP), solderable ACF and Hot-bar soldering.

The conductive interconnection material 26 of the disclosed embodiments is generally a low pressure interconnection technology. In one embodiment, the conductive interconnection material has a maximum of approximately 4 Megapascal (MPa) bonding pressure to achieve a good interconnection. In alternate embodiments, the bonding pressure can be less than 2 MPa or even greater than 2 MPa. The aspects of the disclosed embodiments enable a low pressure interconnection technology where the stress to the support elements, such as the rigid structure component 18, is not as high as typical ACF applications.

Figure 1B:
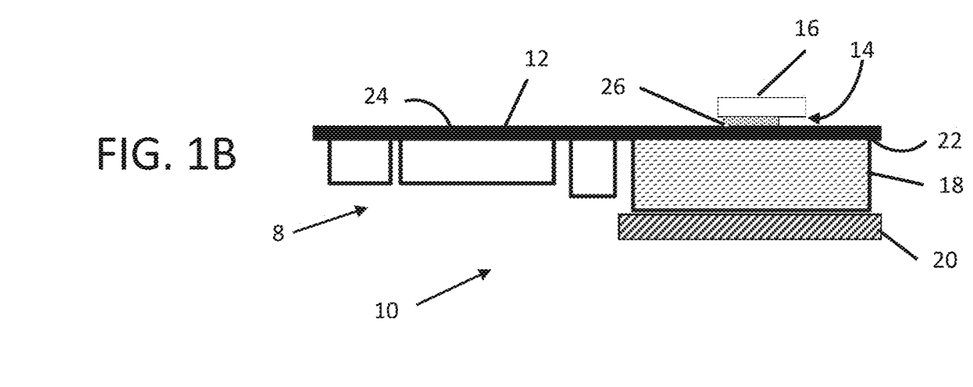

In the example of FIG. 1A, the interconnection interface 14 is disposed on the second side 24 of the printed circuit board 16. The interconnection interface 14 can be disposed at any suitable location on the printed circuit board 16. In this example, the interconnection interface 14 is to a side of the printed circuit board 16, aligned near or with an edge of the rigid structure component 18. In the example of FIG. 1B, the interconnection interface 14 is shown in a different position on the second side 24 of the printed circuit board 16. The examples of FIGS. 1A and 1B are intended to illustrate the flexibility of the positioning and location of the interconnection interface 14 at any suitable position on the second side 24 of the printed circuit board 16 with respect to the rigid structure component 18.

A bonding support block 20 of a suitable bonding jig is shown in the example of FIGS. 1A and 1B. The support block 20 is subjected to the pressure exerted by the bonding head of the bonding equipment. In this manner, the rigid structure component 18 is also subjected to the pressure exerted by the bonding head. Although the size of the support block 20 shown in FIGS. 1A and 1b is shown extending over all or a substantial part of the rigid structure component 18, the aspects of the disclosed embodiments are not so limited. In alternate embodiments, the support block 20 can be any suitable size to provide the pressure needed for the low pressure ACA interconnection bonding process taking place at the interconnection interface 14 on the other side 24 of the PCB 16.

Figure 2A:
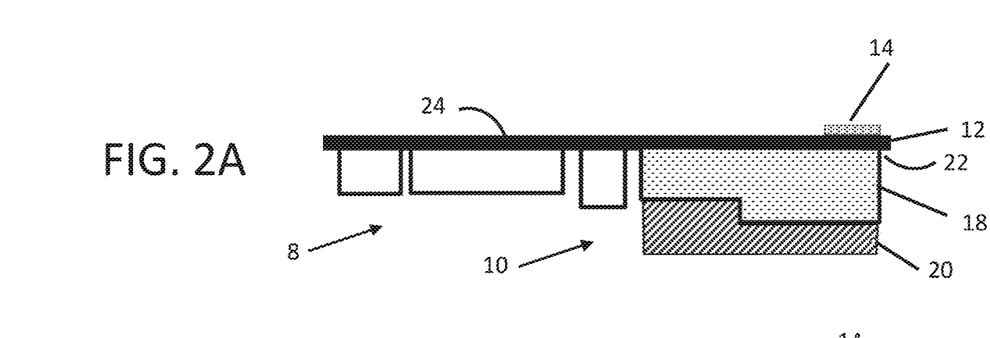
FIGS. 2A and 2B are block diagrams illustrating an apparatus including an exemplary interconnection assembly incorporating aspects of the disclosed embodiments.
Figure 2B:
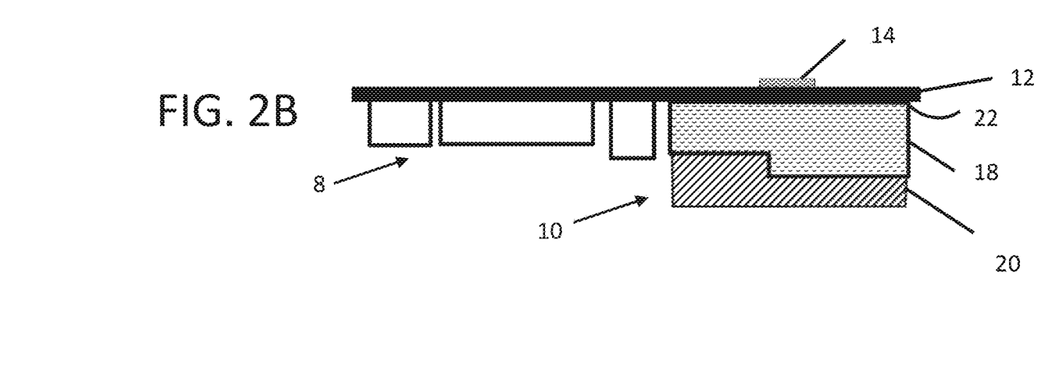

The aspects of the disclosed embodiments utilize the rigid structure component 18 as the supporting element in the formation of the interconnection interface 14, which eliminates the need to maintain a keepout area on the first side 22 of the printed circuit board 16 opposite the interconnection interface 14. In the examples of FIGS. 2A and 2B a top surface of the rigid structure component 18 does not have a regular shape, meaning that it is not flat. The aspects of the disclosed embodiments enable an irregularly shaped rigid structure component 18 to be used to provide a solid backup to the low pressure ACA interconnection bonding process taking place at the interconnection interface 14 on the other side 24 of the PCB 16.

In the example of FIGS. 2A and 2B, the support block 20 of a bonding jig can designed to follow the shape of the rigid structure component 18. The support block 20 is subjected to the pressure exerted by the bonding head of the bonding equipment. In this manner, the rigid structure component 18 is also subjected to the pressure exerted by the bonding head.

The examples of FIGS. 2A and 2B also illustrate the ability to position the interconnection interface 14 at any location on the printed circuit board 16 with reference to the rigid structure component 18. In the example of FIG. 2A, the interconnection interface 14 is disposed to one side, while in the example of FIG. 2B, the interconnection interface 14 is more centrally located with respect to the position of the rigid structure component 18.

Figure 3A:
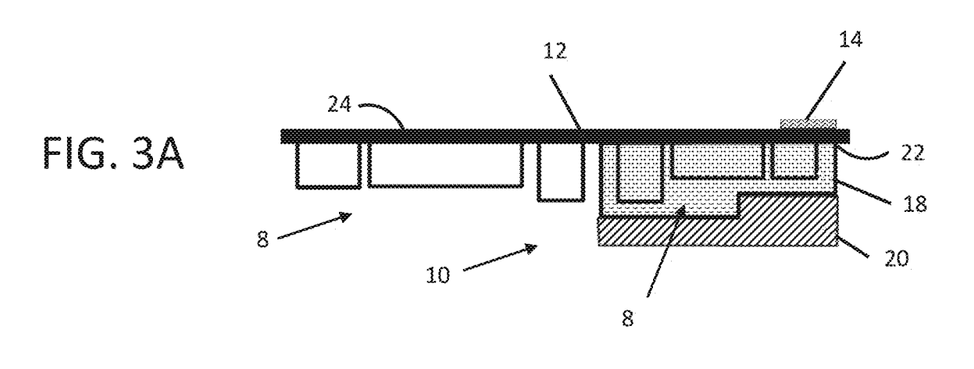
FIGS. 3A and 3B are block diagrams illustrating an apparatus including an exemplary interconnection assembly incorporating aspects of the disclosed embodiments.
Figure 3B:
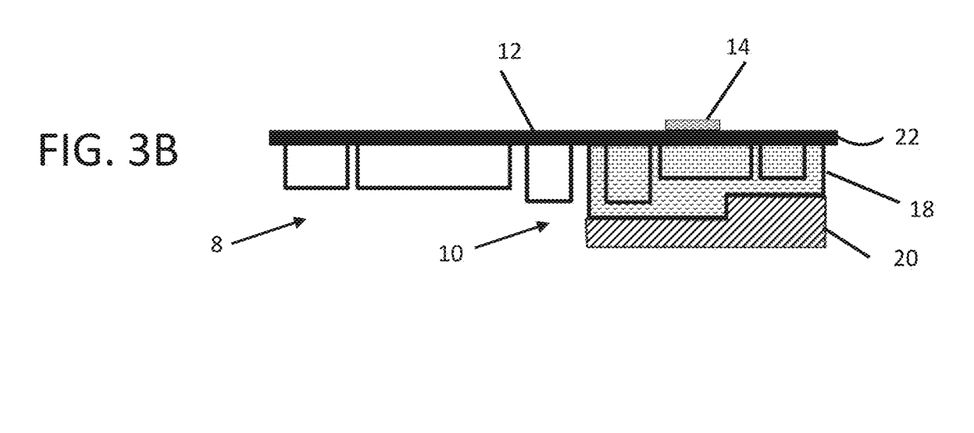

FIGS. 3A and 3B illustrate an example where other components, such as SMT components 8 are located underneath the rigid structure component 18, such as in the case where the rigid structure component 18 is an RF shield. Here again, the interconnection interface 14 is disposed at any suitable location on the side 24 of the printed circuit board 16 opposite the RF shield can 38.

The examples of FIGS. 1A, 1B, 2A, 2B, 3A and 3B illustrate how the side 22 of the printed circuit board 16 opposite the interconnection interface 14, also referred to as the "back side" of the interconnection area, is fully utilizable and there is no need to keep this area free of components, as is the case with existing technologies.

Figure 5A:
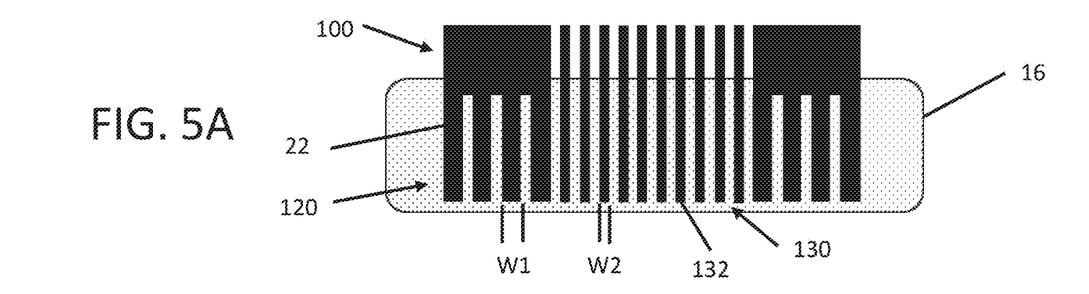
FIG. 5A to 5C are block diagrams illustrating an exemplary interconnection terminal assembly incorporating aspects of the disclosed embodiments.
Figure 5B:
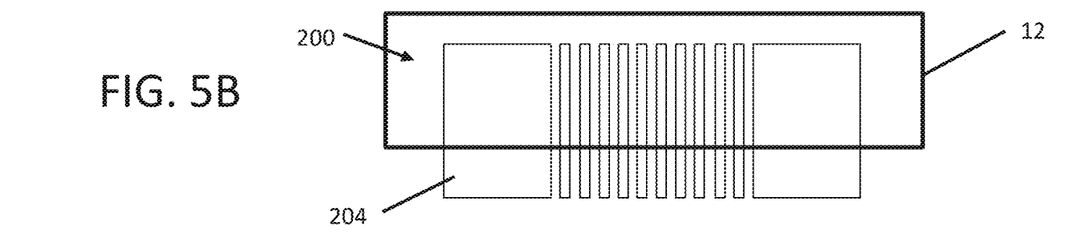
Figure 5C:
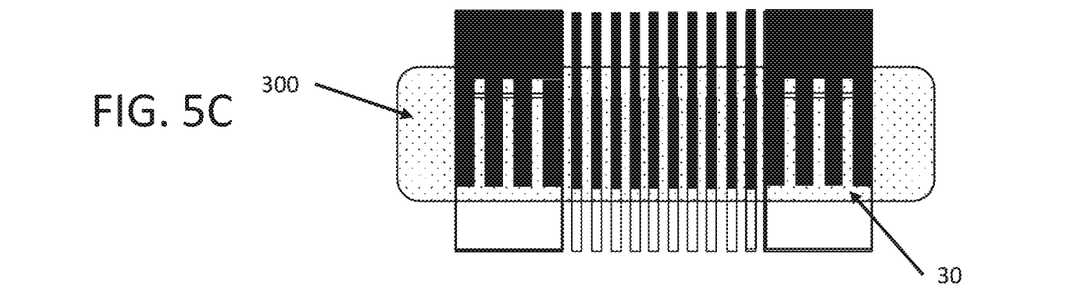

The interconnection interface 14 of the disclosed embodiments enables high current and power applications. FIGS. 5A-5C illustrates one example of interconnection terminals and interconnection terminal layouts for an interconnection interface assembly 14 of the disclosed embodiments.

The traditional rule for interconnection terminal design is a 1:1 ratio for pad width and space for the whole interconnection area. Generally, for larger current carrying capabilities larger pad surface areas are required. However, where smaller volumes are needed for miniaturized design, such larger pad surface areas are not optimum.

Figure 4A:
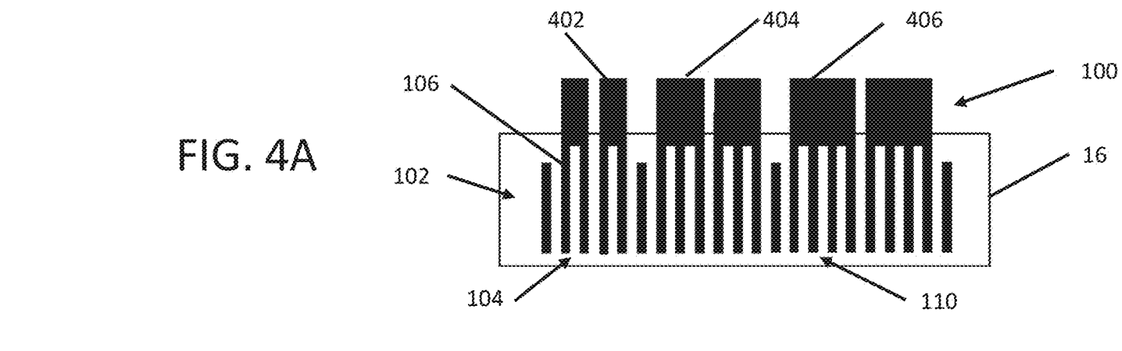
FIGS. 4A to 4C are block diagrams illustrating an exemplary interconnection terminal for an interconnection assembly incorporating aspects of the disclosed embodiments.

Referring to FIG. 4A, a first interconnection terminal 100 for the interconnection interface assembly 14 of the disclosed embodiments is illustrated. In this example, a combination of terminals 102, also referred to herein as bond pads, are arranged on a flexible printed circuit 16. The combination of terminals 102 is configured to maximize the capacity for current and power handling in the interconnection interface 14. Although the first interconnection terminal 100 will generally be described herein with respect to the flexible printed circuit 16, the aspects of the disclosed embodiments are not so limited. In alternate embodiments, the interconnection terminal 100 could be part of the printed circuit board 12 assembly.

In the example of FIG. 4A, the terminals 102 are partially divided on the flexible printed circuit side of the interconnection interface 14 to enable the resin outflow to achieve a highly reliable interconnection. A pair 104 of adjacent terminals 102 are joined together to form fingers 106. For example, bond pad 402 comprises two fingers 106, bond pad 404 comprises three fingers 106 and bond pad 406 comprises four fingers 106. The number of fingers 106 is not limited and any suitable number of fingers 106 can be formed, depending upon the application.

Figure 4B:
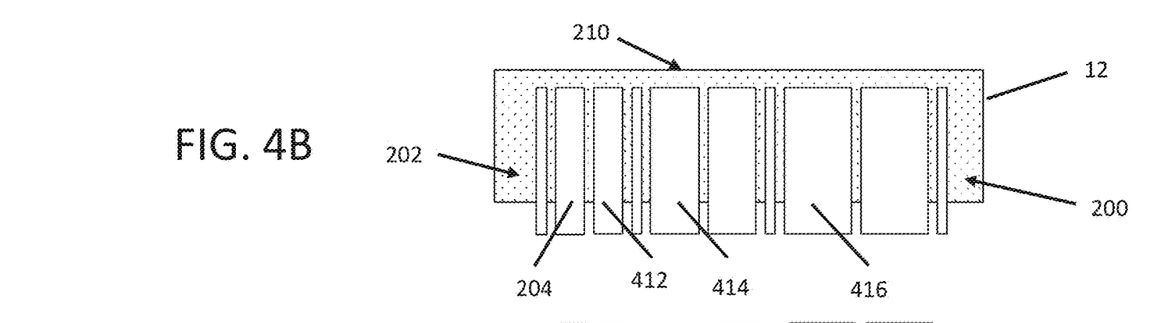

Referring to FIG. 4B, a second set of interconnection terminals 202 is disposed on the printed circuit board 16 side of the interconnection interface 14. The second set of interconnection terminals 202 comprises a set of bond pads of varying size. In one embodiment, the size of the bond pads in the second set of interconnection terminals 202 will correspond to a size of an area occupied by the corresponding fingers 106 in the first set of interconnection terminals 102. The terminal design and combination of terminals 102, 202 of the interconnection interface 14 of the disclosed embodiments enables capacity maximization of current and power handling in the interconnection interface 14. The aspects of the disclosed embodiments enable higher power to be passed through one terminal.

In a typical interconnection terminal design, the pad:space pitch ratio is 1:1. The high power design of the interconnection interface 14 changes this pad:space pitch ratio. As is shown in FIGS. 4A and 4B, the pad:space pitch ratio of the first interconnection terminal 100 is not the same as the pad:space pitch ratio of the second interconnection terminal 200. Rather, in the example of FIGS. 4A and 4B, the a pitch of a pitch pattern 110 of the plurality of adjacent bond pads 102 of the first interconnection terminal 100 is constant and a pitch of a pitch pattern 210 of the plurality of adjacent bond pads 202 of the second interconnection terminal 200 is varied with respect to the pitch pattern 110. The different pitch patterns are configured to enable the thinner fingers 106 to align with the larger pads 204.

Figure 4C:
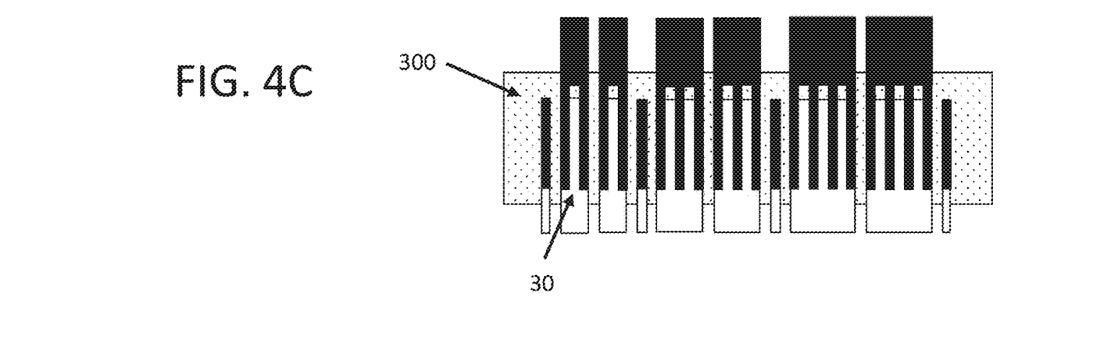

As is shown in FIG. 4C, in a connected state of the first interconnection terminal 100 and the second interconnection terminal 200, at least two adjacent bond pads 104 of the first interconnection terminal 100 form multiple adjoined fingers 106 that in the connected state 300 are configured to overlap and connect to one bond pad 204 of the second interconnection terminal 200. For example, the fingers 106 of terminal 402 interconnect with bond pad 412 of the second interconnection terminal 200, fingers 106 of terminal 404 with bond pad 414 and fingers 106 of terminal 406 with bond pad 416. This allows more current and high power to be carried through one terminal of the interconnection assembly 14.

In the example shown in FIG. 4C, a channel 30 is formed between adjacent fingers 106 of the first interconnection terminal 100 on a corresponding bond pad 202 of the second interconnection terminal 200. The channel 30 enables resin outflow from the conductive interconnecting material 26 during the pressing of the interconnection interface 14. The ability to channel excess conductive interconnecting material 26 away from between the terminals 102 and terminals 202 enables a reliable, low height interconnection solution.

FIGS. 5A-5C illustrate another example of a terminal layout and interconnection for an interconnection interface 14 incorporating aspects of the disclosed embodiments. In this example the first interconnection terminal 100 comprises a first set 120 of the plurality of adjacent bond pads 102 and a second set 130 of the plurality of adjacent bond pads 102. A width (W1) of a bond pad 122 in the first set 120 is greater than a width (W2) of a bond pad 132 in the second set 130.

The ability to be able to use different finger widths is advantageous to either increase the current/power capacity further or to minimizing the area for the interconnection. For example: 3 fingers of 100 um width separated by 100 um gaps gives a terminal width of 500 um (Total conductor width is 300 um). However, when using 2 fingers of 200 um width separated by a 100 um gap, the terminal width is still 500 um but the total conductor width is 400 um. This provides a terminal width that is 100 um wider than the previous example design. More conductor area enables more power capacity.

The aspects of the disclosed embodiments find application with respect to a variety of devices that require miniaturized, highly reliable electrical interconnection between modules. Examples include, but are not limited to, mobile communication devices, smartphones, wearables, augmented reality devices, virtual reality devices, tablets and other computing devices or consumer electronic product that has a need to reduce space for modular interconnections inside the device.

The aspects of the disclosed embodiments utilize the rigid structure component 18 as the supporting element in the formation of the interconnection interface. The use of the rigid structure component eliminates the need to maintain a keepout area on the first side of the printed circuit board opposite the interconnection interface. The terminal design of the interconnection interface provides high current and power carrying capability. The interconnection area of the interconnection interface of the disclosed embodiments is significantly reduced compared to current solutions. This significantly widens the capability to implement the interconnection interface in highly integrated consumer devices and take advantage of the space, height and cost saving benefits that are provided.

Thus, while there have been shown, described and pointed out, fundamental novel features as applied to the exemplary embodiments thereof, it will be understood that various omissions, substitutions and changes in the form and details of devices and methods illustrated, and in their operation, may be made by those skilled in the art without departing from the spirit and scope of the present disclosure. Further, it is expressly intended that all combinations of those elements, which perform substantially the same function in substantially the same way to achieve the same results, are within the scope of the present disclosure. Moreover, it should be recognized that structures and/or elements shown and/or described in connection with any disclosed form or embodiment may be incorporated in any other disclosed or described or suggested form or embodiment as a general matter of design choice. It is the intention, therefore, to be limited only as indicated by the scope of the claims appended hereto.

What is claimed is:

1. An apparatus comprising:
a printed circuit board;
a flexible printed circuit;
a rigid structure component on a first side of the printed circuit board;
an interconnection interface on a second side of the printed circuit board opposite to the rigid structure component, and configured to interconnect the flexible printed circuit and the printed circuit board; and
a conductive interconnection material at the interconnection interface between the flexible printed circuit and the printed circuit board,
wherein
the first interconnection terminal comprises a plurality of adjacent first bond pads and the second interconnection terminal comprises a plurality of adjacent second bond pads, and
in a connected state of the flexible printed circuit and the printed circuit board, a channel is formed between a pair of adjacent first bond pads of the first terminal and a corresponding second bond pad of the second terminal.

2. The apparatus according to claim 1, wherein the conductive interconnection material is an anisotropic conductive adhesive.

3. The apparatus according to claim 1, wherein the conductive interconnection material has a maximum of 4 Megapascal (MPa) bonding pressure to achieve interconnection.

4. The apparatus according to claim 1, wherein
the interconnection interface comprises a first interconnection terminal and a second interconnection terminal,
the first interconnection terminal is on one of the flexible printed circuit or the printed circuit board, and the second interconnection terminal is on the other one of the flexible printed circuit or the printed circuit board, and
the conductive interconnection material is between the first interconnection terminal and the second interconnection terminal.

5. The apparatus according to claim 1, wherein a shape of the rigid structure component is irregular and a shape of a support block corresponds with the irregular shape of the rigid structure component.

6. The apparatus according to claim 1, wherein the interconnection interface is positioned on the second side of the printed circuit board in an area that corresponds to a central region of the rigid structure component on the first side of the printed circuit board.

7. The apparatus according to claim 1, wherein a first pitch of a first pitch pattern of the plurality of adjacent first bond pads of the first interconnection terminal is constant and a second pitch of a second pitch pattern of the plurality of adjacent second bond pads of the second interconnection terminal is varied.

8. The apparatus according to claim 1, wherein at least two adjacent first bond pads of the first interconnection terminal form multiple adjoined fingers that in the connected state overlap and connect to one second bond pad of the second interconnection terminal.

9. The apparatus according to claim 1, wherein the first interconnection terminal comprises a first set of the plurality of adjacent first bond pads and a second set of the plurality of adjacent first bond pads, wherein a width (W1) of a first bond pad in the first set is greater than a width (W2) of a first bond pad in the second set.

10. The apparatus according to claim 9, wherein the first set of the plurality of first adjacent bond pads is configured to be connected to one second bond pad of the second interconnection terminal in the connected state.

11. The apparatus according to claim 1, further comprising:
a bonding support block on a side of the rigid support component opposite to the printed circuit board.

12. A device comprising an apparatus according to claim 1.

13. The apparatus according to claim 1, wherein the printed circuit board is between the flexible printed circuit and the rigid structure component.

14. The apparatus according to claim 1, further comprising:
one or more electrical components on the first side of the printed circuit board within the rigid structure component.

15. The apparatus according to claim 14, wherein the rigid structure component is a radio frequency shield.

16. The apparatus according to claim 15, wherein the radio frequency shield has a stepped shape and a shape of a support block corresponds with the stepped shape of the radio frequency shield.

17. An interconnection interface for bonding a flexible printed circuit to a printed circuit board, the interconnection interface comprising:
- a first interconnection terminal with a plurality of adjacent first bond pads;
- a second interconnection terminal with a plurality of adjacent second bond pads, wherein the first interconnection terminal and the second interconnection terminal are configured to be pressed together in a connected state of the flexible printed circuit and the printed circuit board; and in the connected state of the flexible printed circuit and the printed circuit board, a channel is formed between a pair of the plurality of adjacent first bond pads of the first interconnecting terminal and a corresponding second bond pad of the plurality of adjacent second bond pads of the second interconnection terminal.

18. The interconnection interface according to claim 17, comprising a conductive interconnecting material between the first interconnection terminal and the second interconnection terminal.

* * * * *